(12) United States Patent
Chong et al.

(10) Patent No.: US 8,068,004 B1
(45) Date of Patent: Nov. 29, 2011

(54) EMBEDDED INDUCTOR

(75) Inventors: Nui Chong, Cupertino, CA (US);
Hong-Tsz Pan, Cupertino, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/699,734

(22) Filed: Feb. 3, 2010

(51) Int. Cl.
*H01F 27/28* (2006.01)
*H01F 27/29* (2006.01)
*H01F 5/00* (2006.01)
*H01F 7/06* (2006.01)

(52) U.S. Cl. ........ 336/222; 336/192; 336/200; 336/223; 336/232; 29/602.1; 29/605; 29/606

(58) Field of Classification Search .................. None
See application file for complete search history.

(56) References Cited

U.S. PATENT DOCUMENTS

| | | | | |
|---|---|---|---|---|
| 5,349,743 A | * | 9/1994 | Grader et al. | 29/602.1 |
| 6,031,445 A | * | 2/2000 | Marty et al. | 336/200 |
| 6,534,249 B2 | * | 3/2003 | Fork et al. | 430/322 |
| 6,611,188 B2 | * | 8/2003 | Yeo et al. | 336/192 |
| 6,614,093 B2 | * | 9/2003 | Ott et al. | 257/531 |
| 6,664,881 B1 | * | 12/2003 | Thompson et al. | 336/200 |
| 6,759,727 B2 | | 7/2004 | Ju | |
| 6,975,199 B2 | * | 12/2005 | Long et al. | 336/200 |
| 7,071,807 B1 | * | 7/2006 | Herbert | 336/234 |
| 7,109,838 B2 | * | 9/2006 | Brennan et al. | 336/200 |
| 7,250,826 B2 | | 7/2007 | Gabara | |
| 7,429,899 B2 | | 9/2008 | Gabara | |
| 7,501,903 B2 | | 3/2009 | Gabara | |
| 7,508,280 B2 | | 3/2009 | Gabara | |
| 7,511,588 B2 | | 3/2009 | Gabara | |
| 7,701,319 B2 | * | 4/2010 | Kitamura et al. | 336/200 |
| 7,786,836 B2 | | 8/2010 | Gabara | |

OTHER PUBLICATIONS

Galal, S., "Broadband ESD Protection Circuits in CMOS Technology", IEEE Journal of Solid-State Circuits, vol. 38, No. 12, Dec. 2003, pp. 2334-2340.
Kossel, M., et al., "A T-Coil-Enhanced 8.5 Gb/s High-Swing SST Transmitter in 65 nm Bulk CMOS With <-16 dB Return Loss Over 10 GHz Bandwidth", IEEE Journal of Solid-State Circuits, vol. 43, No. 12, Dec. 2008, pp. 2905-2920.
Pillai, E.R., et al., "Novel T-Coil Structure and Implementation in a 6.4-Gb/s CMOS Receiver to Meet Return Loss Specifications", $57^{th}$ 2007 Electronic Components and Technology Conference, May 29-Jun. 1, 2007, pp. 147-153, Reno, NV USA.
U.S. Appl. No. 13/075,059, filed Mar. 29, 2011, Michael O. Jenkins, et al., Xilinx, Inc., 2100 Logic Drive, SJ, CA USA.
Telli, A. "Practical performance of planar spiral inductors", ICECS 2004, Proceedings of the 2004 $11^{th}$ International Conference, Tel-Aviv, Israel, p. 487-490, Dec. 13-15, 2004.

* cited by examiner

*Primary Examiner* — Anh Mai
*Assistant Examiner* — Mangtin Lian
(74) *Attorney, Agent, or Firm* — W. Eric Webostad; Gerald Chan

(57) ABSTRACT

An embedded inductor and a method for forming an inductor are described. Spaced apart first stripes are formed substantially parallel with respect to one another as part of a first metal layer. First contacts, second contacts, and third contacts in respective combination provide at least portions of posts. Spaced apart second stripes substantially parallel with respect to one another and to the first stripes are formed as part of a second metal layer located between the first metal layer and the second metal layer. The first stripes, the posts, and the second stripes in combination provide turns of a coil.

12 Claims, 7 Drawing Sheets

EMBEDDED INDUCTOR

FIELD OF THE INVENTION

The invention relates to integrated circuit devices ("ICs"). More particularly, the invention relates to an embedded inductor for an IC.

BACKGROUND OF THE INVENTION

As is known, inductors generate magnetic fields. Conventional embedded ("on-chip") spiral inductors, such as found in high-speed and RF applications, are sometimes fabricated using a backend of the line ("BEOL") process which is compatible with the formation of metal layers.

On-chip inductors are conventionally made of a single metal layer in a planar spiral pattern. The resultant magnetic flux from such on-chip inductors is in a direction that couples with a silicon substrate. The magnetic coupling of the magnetic flux generated by an inductor with such substrate promotes eddy currents, which may lead to a low gain ("Q-factor") at high frequencies. To enhance inductor gain, others have proposed having: a higher substrate resistance, such as by use of an epitaxial layer; laminated conductive patterns, such as polysilicon strips; or a larger inductor to substrate distance, such as forming an inductor at a final metal layer in order to reduce eddy current. Unfortunately, these various techniques may add cost and/or may not provide a sufficient reduction in magnetic coupling between magnetic flux generated by an inductor and a substrate.

The inductance of a spiral inductor is roughly proportional to $N^2A$, where N is the number of turns of such spiral inductor, and A is the cross-sectional area of wires forming turns of such spiral inductor. Conventional on-chip inductors use a significant amount of area and sometimes use dedicated metal layers to reach target inductances and Q-factor values. Metal thickness, width, and spacing between turns may be large to reduce series resistance and shunt capacitance in order to obtain more substantial gain. Furthermore, to avoid adverse effects associated with a magnetic field which is orthogonal to the upper surface plane of a substrate as generated by a planar spiral inductor, design rules conventionally forbid placement of any devices, such as transistors, directly underneath or in near proximity to an inductor, as such magnetic field may have negative impact on behavior of such devices. This placement restriction of an on-chip inductor may thus cost a significant amount of semiconductor area.

Accordingly, it would be desirable and useful to provide means that avoids one or more of the above mentioned limitations of on-chip planar spiral inductors.

SUMMARY OF THE INVENTION

One or more embodiments generally relate to an embedded inductor for an IC.

An embodiment relates generally to a method for forming an inductor. In this embodiment, spaced apart first stripes are formed substantially parallel with respect to one another as part of a first metal layer. First contacts respectively associated with upper surface ends of each of the first stripes are formed as part of a first via layer. Second contacts respectively associated with each of the first contacts are formed as part of a second metal layer. Third contacts respectively associated with each of the second contacts are formed as part of a second via layer. Spaced apart second stripes are formed substantially parallel with respect to one another and to the first stripes as part of a third metal layer.

Another embodiment relates generally to an embedded inductor. In this embodiment, the embedded inductor includes first conductive stripes, and second conductive stripes. The first conductive stripes extend in a widthwise direction with respect to a coil and are substantially parallel with one another. The second conductive stripes extend in the widthwise direction with respect to the coil and are substantially parallel with one another. Bottoms of first conductive stacks are respectively in electrical continuity with first ends of the first conductive stripes. Bottoms of second conductive stacks are respectively in electrical continuity with second ends of the first conductive stripes. The first conductive stacks and the second conductive stacks extend in an upward direction respectively away from the first conductive stripes. Tops of the first conductive stacks are respectively in electrical continuity with first ends of the second conductive stripes. Tops of the second conductive stacks are respectively in electrical continuity with second ends of the second conductive stripes. The first conductive stripes, the second conductive stripes, the first conductive stacks, and the second conductive stacks in combination respectively form open loops associated with turns of the coil. Conductors for respectively interconnecting the open loops one to another are to provide electrical continuity from an input end to an output end of the coil.

Yet another embodiment relates to another embedded inductor. In this embodiment, a first conductive plate extends in a lengthwise direction of a spiraled coil. A first conductive wall has a first height, and a second conductive wall has a second height greater than the first height. A bottom surface of the first conductive wall extends in the lengthwise direction and is aligned to and in contact with a left side of the first conductive plate. A bottom surface of the second conductive wall extends in the lengthwise direction and is aligned to and in contact with a right side of the first conductive plate. A second conductive plate extends in the lengthwise direction. A third conductive plate extending in the lengthwise direction. A third conductive wall has a third height less than the first height.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

In the following description, fabrication of embedded inductors compatible with a conventional metal layer and contact BEOL processing is described, where such inductors may be used for high-speed and RF applications. Such inductors may be made of metal and are formed using in part via stacks. As shall be understood from the following description, such inductors are horizontal inductors even though they are formed in part in the vertical direction by vertical stacking of layers. By horizontal inductor, it is generally meant that the axis of the magnetic field or magnetic flux ("B") generated is aligned such that it is substantially parallel with the plane of the upper surface of a substrate, such as a silicon substrate, used to form the IC in which the inductor is embedded. As used throughout herein the term "substantially" is meant to include either or both an approximation or equivalence. By having the magnetic field parallel with the plane of a silicon substrate upper surface, eddy currents may be eliminated or reduced. Accordingly, a Q-factor at high frequencies has significantly less loss due to eddy currents associated with such substrate. Furthermore, inductor series resistance may be reduced by widening metal width as described below in additional detail. The latitude to widen metal width of horizontal inductors described herein is facilitated at least in part by having a relatively small footprint in comparison to a conventional planar spiral inductor footprint. Because horizontal inductors have magnetic flux oriented in a direction that does not interact, or at least does not significantly interact, with a silicon substrate, such inductors allow for more flexibility in placement of devices, such as transistors, underneath them. In the following description, horizontal spiral, horizontal solenoid, and horizontal toroid inductors are described. Even though inductors are depicted as being formed starting from a designated bottom and proceeding upward, it should be understood that such inductors may in other embodiments be formed upside down from the depicted embodiments.

Figure 1:
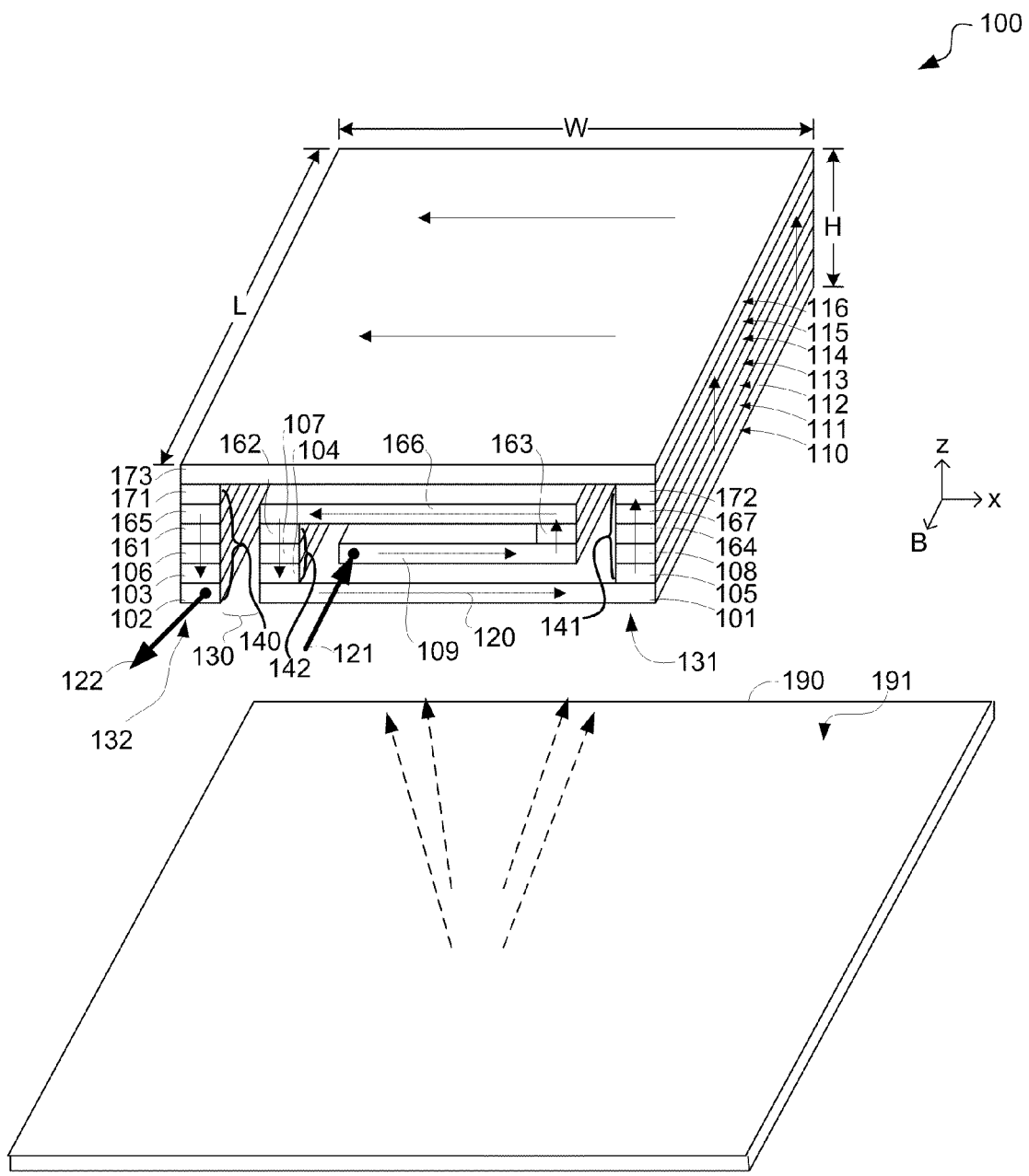
FIG. 1 is a perspective view depicting an exemplary embodiment of a horizontal spiral inductor.

FIG. 1 is a perspective view depicting an exemplary embodiment of a horizontal spiral, namely a spiraled coil, inductor 100. Inductor 100 is formed using alternating metal and via layers. Because inductor 100 extends in the lengthwise direction L, inductor 100 generates a magnetic field of a horizontal inductor.

Inductor 100 includes conductive plate 101 and conductive stripe 102, both of which are formed during semiconductor processing as associated with a metal layer 110. Conductive plate 101 and conductive stripe 102 extend in a lengthwise direction with respect to a vertical spiral or coil 120 of inductor 100. Coil 120 is generally indicated by arrows, and such arrows also indicate the direction of current flow from an input port 121 to an output port 122 of inductor 100. Of course, current flow from port 121 to port 122 may be used, in which application the direction of arrows of coil 120 would be reversed.

It should be appreciated that stripe 102 is spaced apart and in parallel with plate 101 as generally indicated by gap 130. It should further be understood that a dielectric layer may be etched to form recesses for forming plate 101 and stripe 102. For purposes of orientation, an upper surface 191 of a substrate 190 is illustratively depicted to indicate that a bottom surface 131 of plate 101 for example, as well as a bottom surface 132 of stripe 102, are in parallel planes ("parallel-planar") or substantially parallel-planar with one another and with an upper surface 191 of substrate 190.

It should be appreciated that direction of magnetic flux or magnetic field B as generated by operation of inductor 100 is at least generally parallel to the plane of upper surface 191 of substrate 190. Effectively, this means that the amount of eddy current, if any, imparted into substrate 190 is not significant. This is due, in part, to the direction of magnetic field B of inductor 100 being substantially parallel-planar with upper surface 191.

Disposed above plate 101 and stripe 102 is via layer 111. Via layer 111 is used for forming stripes 103, 104, and 105. Stripe 103 is formed above stripe 102 for forming a portion of a wall or stack 140. Stripe 104 is formed aligned to a left edge of plate 101, and stripe 105 is formed aligned to a right edge of plate 101. Stripes 102 through 105 all extend in the lengthwise direction L, and stripes 103 through 105 are all parallel, or substantially parallel, with respect to one another, as well as parallel with respect to stripe 102 though one layer above stripe 102.

Respectively disposed above and parallel, or substantially parallel, with stripes 103, 104, and 105 are stripes 106, 107, and 108. Stripes 106, 107, and 108 are formed as part of metal layer 112 and extend in a lengthwise direction L. Also formed as part of metal layer 112 is plate 109. Stripes 106, 107, and 108 are all formed parallel, or substantially parallel, with respect to one another. Likewise, plate 109 is formed parallel, or substantially parallel, with stripes 106 through 108. Plate 109 is spaced apart from and located above plate 101 and in parallel-planar, or substantially parallel-planar, therewith. More particularly, a bottom surface of plate 109 is parallel-planar or substantially parallel-planar with an upper surface of plate 101. It should be understood that a dielectric fill layer may be located within the spiral formed by coil 120, but is not illustratively shown for purposes of clarity and not limitation.

Respectively disposed above and parallel, or substantially parallel, with stripes 106, 107, and 108 are stripes 161, 162, and 164. Stripes 161, 162, and 164 extend in lengthwise direction L and are parallel, or substantially parallel, with one another, as well as with respect to stripes 106, 107, and 108. Additionally, stripe 163 is formed above plate 109 aligned to a right side edge thereof, and stripe 163 is parallel, or substantially parallel, with respect to stripes 162 and 164. A bottom surface of stripe 163 is parallel-planar and contiguous with a portion of a top surface of plate 109. Stripes 161 through 164 are formed as part of via layer 113.

Respectively disposed above and parallel, or substantially parallel, with stripes 161 and 164 are stripes 165 and 167. Stripes 165 and 167 are formed as part of a metal layer 114. Stripes 165 and 167 are parallel, or substantially parallel, with respect to one another as well as with respect to stripes 161 and 164. Also formed as part of metal layer 114 is plate 166. Plate 166 is formed above stripes 162 and 163, where stripe 162 is aligned to a left edge of plate 166 and stripe 163 is aligned to a right edge of plate 166. A portion of a bottom surface of plate 166 is parallel-planar and contiguous, or substantially parallel-planar and contiguous, with an upper surface of stripe 163. Plate 166 is parallel, or substantially parallel, to plate 109.

Stripes 171 and 172 are respectively disposed above stripes 165 and 167, and are parallel, or substantially parallel, with respect to one another and with respect to stripes 171 and 172. Stripes 171 and 172 are formed as part of via layer 115. A plate 173 is formed above stripes 171 and 172 as part of metal layer 116. A left edge of plate 173 is aligned to stripe 171 and a right edge of plate 173 is aligned to stripe 172. Respective portions of a bottom surface of plate 173 are parallel-planar and contiguous, or substantially parallel-planar and contiguous, with upper surfaces of strips 171 and 172. Plate 173 is parallel with plate 166.

Stripes 102, 103, 106, 161, 165, and 171 in combination form wall 140. Stripes 105, 108, 164, 167, and 172 in combination form wall 141. Wall 140 is taller than wall 141 by one layer, which in this embodiment is due to the thickness of metal layer 110. A wall 142 is formed of stripes 104, 107, and 162 in combination. Wall 142 is smaller by two layers, namely the thickness of metal layers 110 and 114, than wall 141. Stripe 163 forms yet another wall, namely wall 163 as it is a single stripe tall wall, which is shorter than wall 142, namely by the thickness of metal layers 112 and 114.

Walls 140 through 142, and 163 all extend in a lengthwise direction L. Because of the difference in height and positioning of such walls, plates 101, 109, 166, and 173 are spaced apart from one another in a vertical direction H as associated with the height of inductor 100, where the offset between nearest neighbor plates is one via layer in this exemplary embodiment. However, it should be understood that in other embodiments more than one via layer may be used. For the example embodiment, the offset distance between an upper surface of plate 101 and a bottom surface of plate 109 is the thickness of via layer 112.

Furthermore, walls 140 through 142 and 163 are spaced apart from one another and aligned to at least one edge of at least one plate, as described below in additional detail. Wall 140 is generally aligned to a left edge of plate 173, and wall 141 is generally aligned to respective right edges of plate 173 and plate 101. Wall 140 is spaced apart from wall 142 in a widthwise direction W. Wall 163 is spaced apart from wall 141 in widthwise direction W. Walls 140 and 141 are exterior walls of coil 120 and walls 142 and 163 are interior walls of coil 120. Wall 142 is generally aligned to left edges of plates 166 and 101. Wall 163 is generally aligned to right edges of plates 109 and 166. Plate 173 is a top exterior plate of inductor 100, and plate 101 is bottom exterior plate of inductor 100. Plate 166 is a top interior plate of inductor 100, and plate 109 is a bottom interior plate of inductor 100. It should be understood that plate 173 is wider than plate 101, and plate 101 is wider than plate 166. Lastly, it should be understood that plate 166 is wider than plate 109. By width, it is meant a widthwise direction W. Furthermore, by height of walls it is generally meant in vertical direction z, namely a height as indicated by H.

Figure 2:
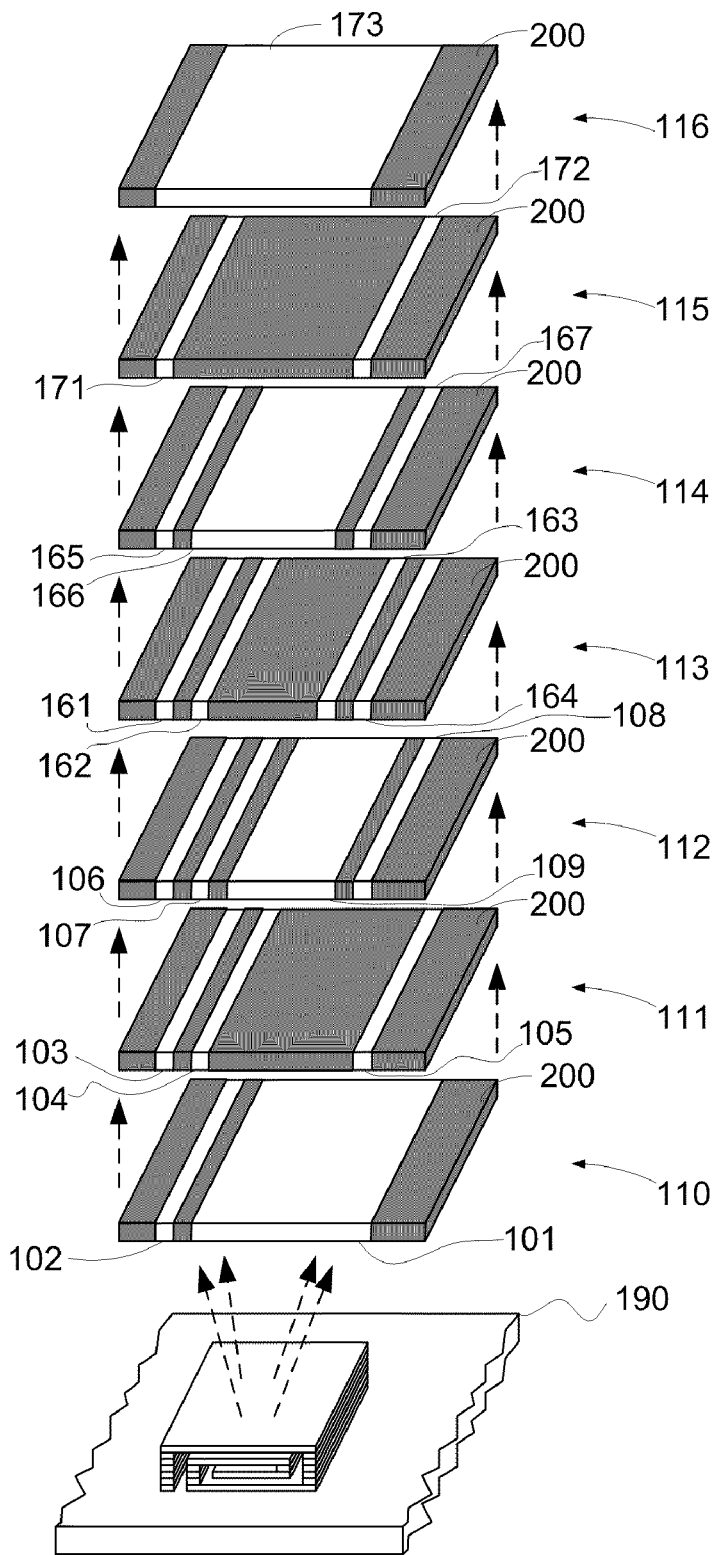
FIG. 2 is an exploded view depicting an exemplary embodiment of a progression of layers for forming the spiral inductor of FIG. 1.

FIG. 2 is an exploded view depicting an exemplary embodiment of the progression of layers 110 through 116 for forming plates and stripes as described with reference to FIG. 1 for the exemplary embodiment of spiral inductor 100. In FIG. 2, dielectric material for each layer, such as dielectric material 200 as associated with formation of metal layer 110, is illustratively depicted. It should be understood that inductor 100 may be formed using alternating metal and via layers for a BEOL metal/interconnect process. For example, metal layers may be formed to include deposition of copper followed by a chemical-mechanical-polishing ("CMP") as part of a conventional formation of a metal layer. Via layers may be formed with a BEOL via first or trench first dual-damascene semiconductor process.

Even though the example of four metal layers and three via layers is illustratively depicted, it should be understood that fewer or more metal and via layers may be used. For example, even though a two-turn spiral is illustratively depicted for coil 120, more or fewer than two turns may be formed.

By interconnecting metal layers using one or more via layers therebetween, a spiral cross-section, as generally depicted as coil 120 in FIG. 1, is formed having the magnetic field B which is perpendicular to a z axis, namely a substrate plane vertical axis. Thus inter-metal dielectric materials as indicated in FIG. 2, may be used to define trenches for filling with metal or other conductor for forming inductor 100.

In the depicted embodiment, a trench pattern for vias as stripes having rectangular cross-sections may be used. This is to facilitate connection to metal layers above and beneath such stripes to reduce resistance. In an alternative embodiment, such long stripes may be segmented using conventional vias, and more particularly, an array of such vias; however, while more closely keeping with a conventional via formation, this would increase overall inductor series resistance. Furthermore, a via etch recipe may be tailored to avoid overetching into a metal layer underneath for a larger via pattern, namely stripes as opposed to contact holes. In other words, it should be understood that vias are conventionally holes and not stripes, and thus a via etch may have to be adjusted to account for stripes as opposed to holes to avoid over etching.

Inductor 100 is a two terminal inductor where circuitry may be connected to input port 121 and output port 122, with respect to direction of current flow through inductor 100. It has been assumed that electrical current flow is from port 121 to port 122, however, current may flow in the opposite direction. However, for purposes of clarity by way of example and not limitation, assuming the current flow as indicated by arrows of coil 120, a resultant magnetic field will be directed out of the plane of the image, as generally indicated as direction B, for current running counterclockwise through inductor 100.

It should be understood that little to no eddy current is generated in substrate 190 as direction B of magnetic flux is orthogonal to the z axis. Accordingly, inductor gain is not, or at least not significantly, negatively impacted by eddy currents owing to the orientation of magnetic flux. Furthermore, placement of transistors or other devices underneath inductor 100 may be acceptable as the direction of magnetic flux is on a parallel plane to upper surface 191 of substrate 190. The ability to include inductor 100 above other circuitry saves semiconductor area, which may result in a smaller die area size.

Conductance of horizontal spiral inductor 100 is roughly proportional to N2A, where N is the number of turns and A is the area of a cross-section of inductor 100, namely W multiplied by H is the cross-sectional area A. Assuming a BEOL semiconductor process for formation of metal layers and via layers is generally in fixed increments, inductance may be adjusted by either or both the number of metal and via layers used, namely affecting height H, or inductor width, namely affecting width W. It should be understood that inductor 100 thus may be built with fewer metal layers and turns as long as width W is sufficient to attain a target inductance. This ability to affect inductance through W enhances flexibility for other circuits to be used for metal interconnect underneath or above inductor 100 and hence may save semiconductor die area.

Geometric parameter length L of inductor 100 may be sufficiently long to lower series resistance for higher Q-factor without changing a BEOL process, in spite of an increased footprint in the L direction. Furthermore, using low dielectric constant materials for inter-metal dielectric layers may further enhance a Q-factor due to lower parasitic shunt inductance. Additionally, even though the example of copper was mentioned for metal, it should be understood that any conductive material suitable for an inductance to be generated for integration in BEOL processing may be used.

Accordingly, it should be appreciated that walls, such as exterior walls 140 and 141, where wall 141 is supported on a bottom side by plate 101, are used to support plate 173, along with an inner dielectric material for bridging for example plate 166, namely for bridging an interior turn of conductor 100.

To recapitulate, it should be understood that coil 120 extends in a lengthwise direction L, as current is generally passed in a widthwise direction W and a vertical direction H for passing through a spiral of coil 120. In other words, the lengthwise direction is generally transverse, or substantially transverse, with respect to direction of current flow, as well as the widthwise direction W. Moreover, current flow through the spiral is transverse, or substantially transverse, with respect to the lengthwise or horizontal orientation of inductor 100. Thus, a parallel-planar magnetic field B may be induced with respect to an upper surface of substrate 190, where substrate 190 is a die substrate of an IC in which inductor 100 is embedded.

Figure 3A:
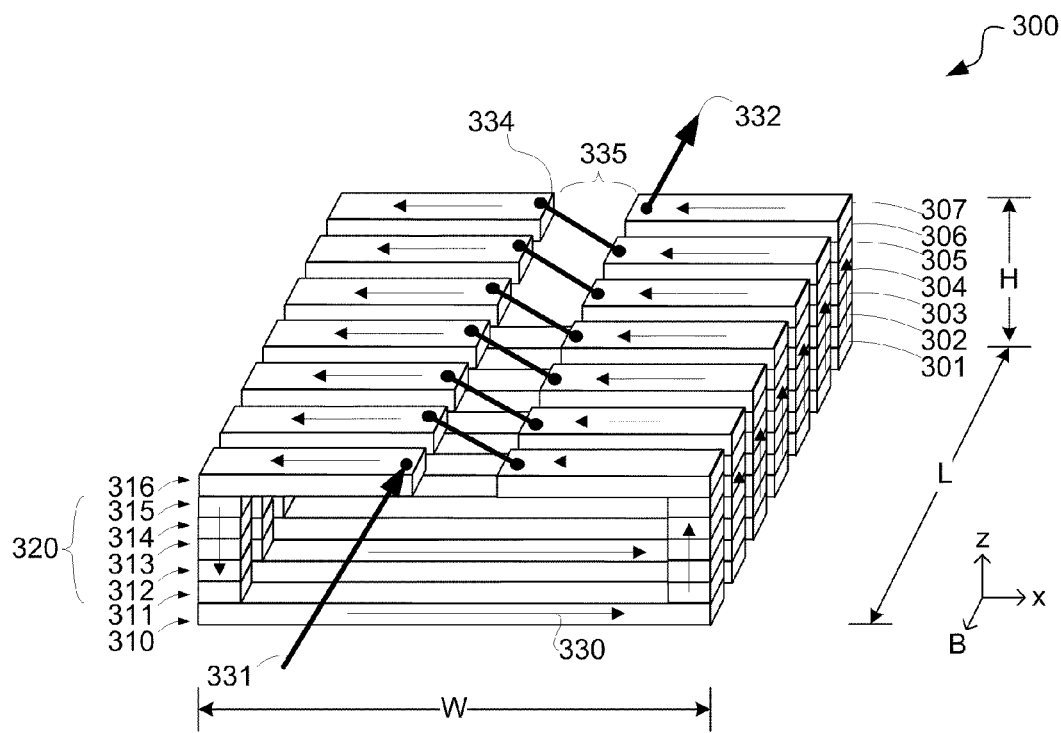
FIG. 3A is a perspective view depicting an exemplary embodiment of a horizontal solenoid inductor.

Referring to FIG. 3A, there is shown a perspective view depicting an exemplary embodiment of a horizontal solenoid inductor, namely solenoid inductor or solenoid 300. In this exemplary embodiment, solenoid 300 includes seven turns; however, fewer or more than seven turns may be implemented. It should be understood that solenoid 300 extends in a lengthwise direction L, as current is passed generally in a widthwise direction W and a vertical direction H for passing around turns of solenoid 300. In other words, current flow through or around each turn is substantially transverse with respect to the lengthwise or horizontal orientation of inductor 100, and thus a parallel-planar magnetic field B may be with respect to an upper surface of substrate 190, where substrate 190 is a die substrate of an IC in which inductor 100 is embedded.

A plurality of stripes having a widthwise, W, orientation are formed as part of a metal layer 310. Stripes 301 are substantially parallel with respect to one another, and spaced apart from one another. Formed above stripes 301 are contacts, such as blocks 302. Even though contacts are illustratively depicted herein as blocks, it should be understood that any of a variety of volumes may be used for contacts, including, e.g., blocks with rounded corners and cylinders. Half of blocks 302 are formed aligned to a right side or right end of stripes 301, where there is a block 302 above each stripe 301. Another half of blocks 302 are formed aligned to a left end of stripes 301. Blocks 302 are formed as part of via layer 311.

Blocks 303 are formed respectively above blocks 302. Blocks 303 are aligned to blocks 302 for forming part of posts 320 in the depicted exemplary embodiment. Blocks 303 are formed as part of metal layer 312. Additional blocks 302 and 303 may be formed with via layer 313 and metal layer 314, respectively, for increasing the height of posts 320. For example, blocks 304, which may be the same as blocks 302, may be formed respectively above blocks 303 as part of via layer 313. Blocks 305, which may be formed the same as blocks 303, may be respectively formed above blocks 304. Blocks 305 are formed as part of metal layer 314. Blocks 306, which may be formed the same as either or both of blocks 302 and 304, are respectively formed above blocks 305 as part of via layer 315. Accordingly, it should be appreciated that a sequence of blocks 302 through 306 respectively formed using alternating metal and via layers, namely layers 311 through 315, may be used to form posts 320.

A metal layer 316 is used to form conductive stripes 307. Conductive stripes 307 are respectively located above posts 320. Half of stripes 307 are respectively located above and aligned to right side posts 320, where right ends of stripes 307 are aligned to right ends of stripes 301, with right side posts 320 aligned to and respectively located between such right ends. The other half of stripes 307, namely left side stripes 307, have their left ends respectively aligned to left ends of stripes 301, with left side posts 320 aligned to and respectively located between such left ends. Thus posts 320 offset stripes 301 from stripes 307.

Conductive stripes 301 and 307 extend in a widthwise W direction, where stripes 307 are respectively substantially parallel with respect to stripes 301. Thus, stripes 307 are parallel with respect to one another and are spaced apart from one another. It should be understood that the spacing of stripes 301 from one another and the spacing of stripes 307 from one another may be a substantially uniform spacing.

An input port 331 is provided to a front-most stripe 307 and an output port 332 is obtained from a back-most stripe 307. Accordingly, arrows as generally associated with coil 330 are in a counterclockwise direction for indicating direction of current flow for port 331 being an input port and port 332 being an output port. In the exemplary embodiment of solenoid 300, wires 334 are illustratively depicted. Wires 334 may be conductors for bridging a gap 335. More particularly, pairs of stripes 307 are respectively aligned to associated stripes 301 in a widthwise direction. Such pairs of stripes 307 have a gap 335 therebetween. Thus, a pair of stripes 307, a pair of associated posts 320, and an associated stripe 301 form an open loop. In this exemplary embodiment, input port 331 is provided to a right internal side of a left front-most stripe 307. A right front-most stripe 307 has a left end which is connected by a wire 334 to a right end of a next front-most left side stripe 307. Accordingly, it should be understood that wires 334 may be used to interconnect a stripe 307 on one side to a neighboring stripe 307 on another side for interconnecting open loops for forming turns of coil 330. This allows electrical current to be conducted from port 331 to port 332 for example in a counter-clockwise direction. Alternatively, current may flow in a clockwise direction, where port 332 is an input port and port 331 is an output port. However, for purposes of clarity by way of example and not limitation, it shall be assumed that port 331 is an input port and port 332 is an output port. Thus, magnetic field B is generated in a parallel-planar direction (i.e., out of the front of the page, as opposed to out of the back of the page) with respect to an upper surface of a substrate of an IC in which solenoid 300 is embedded.

It should be understood that posts 320 extended in an upward direction respectively from stripes 301 and form conductors for electrically connecting stripes 307 and stripes 301, respectively. Posts 320 in the depicted embodiment are rectangular solids. More particularly, posts 320 in the depicted embodiment are rectangular solids with square ends. However, it should be understood that cylindrical or other geometric solids may be used.

Turns associated with coil 330 extend in a lengthwise L or horizontal direction for solenoid 300. Accordingly, wires 334 may be formed above stripes 307 for interconnection to form turns of solenoid 300. Alternatively, wires 334 may be formed as part of metal layer 316.

Figure 3B:
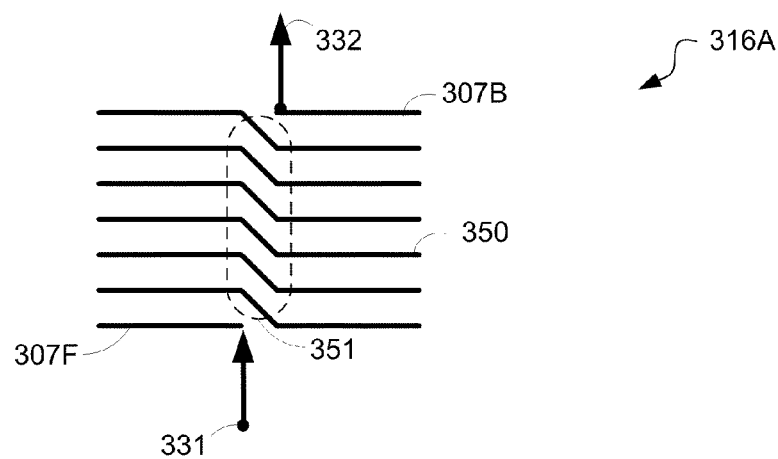
FIG. 3B is a top view depicting an exemplary embodiment of an alternative metal layer for the solenoid inductor of FIG. 3A.

FIG. 3B is a top view depicting an exemplary embodiment of an alternative metal layer 316A for solenoid 300 of FIG.

3A. Metal layer 316A includes input port 331 and output port 332 as previously described, as well as a front-most left side stripe 307F and back-most right side stripe 307B, as associated with two of previously described stripes 307. Additionally, stepped substantially parallel conductive lines 350 are formed as part of metal layer 316A. Each stepped stripe 350 replaces a right stripe 307, a left neighboring stripe 307, and an associated interconnect wire 334. Thus the diagonal conductive segments 351 of stepped stripes 350 respectively replace wires 334, and such diagonal portion is formed as part of the same metal layer 316A used to form stripes 307F and 307B.

With simultaneous reference to FIGS. 3A and 3B, solenoid 300 is further described. Solenoid 300 may be formed using alternating metal and via layers, namely BEOL semiconductor fabrication as previously described with reference to FIGS. 1 and 2. Once again, magnetic field B is generated in a direction which is parallel-planar with a substrate in which solenoid 300 is embedded, such as substrate 490 of FIG. 4.

Figure 4:
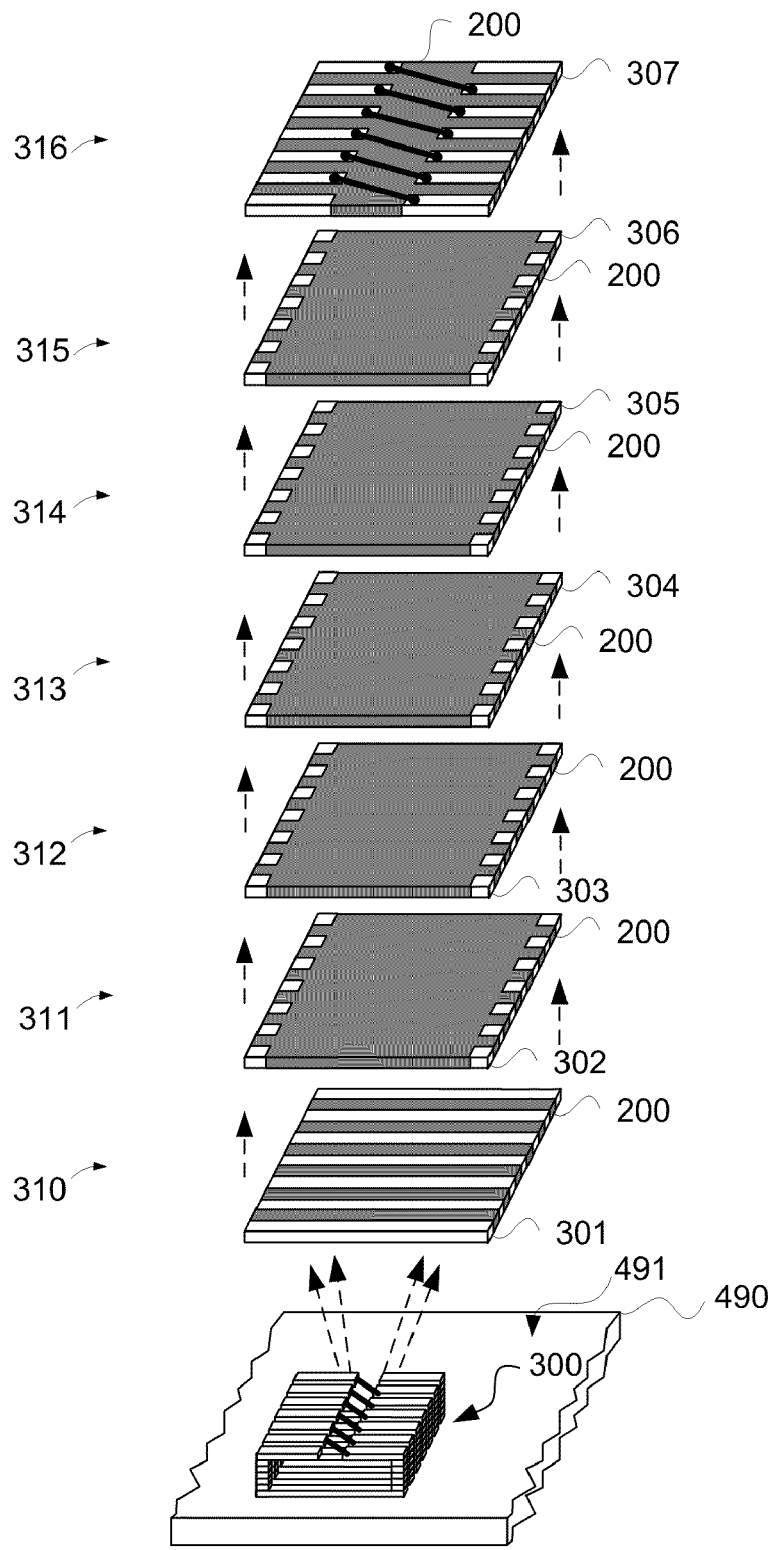
FIG. 4 is an exploded view depicting an exemplary embodiment of a progression of layers for forming the solenoid of FIG. 3A.

FIG. 4 is an exploded view depicting an exemplary embodiment of a progression of layers for forming solenoid 300. Solenoid 300 may be formed such that magnetic field B is substantially parallel-planar to an upper surface 491 of substrate 490, where substrate 490 is a substrate of an integrated circuit in which solenoid 300 is embedded. Metal layer 310 is used for forming conductive stripes 301. Via layer 311 is used for forming blocks 302. In the exemplary embodiment of FIG. 4, layers 310 through 316 have dielectric material 200 which is etched to form patterns for forming stripes 301, blocks 302 through 306, and stripes 307. Even though dielectric material 200 is used throughout herein, it should be understood that same or different dielectric materials, including single or multiple dielectric layers, may be used for the various metal and via layers.

With simultaneous reference to FIGS. 3A, 3B, and 4, solenoid 300 is further described. Solenoid 300 has an inductance which is roughly proportional to M2A/L, where M is the number of turns, A is the cross-sectional area of a turn, and L is length. Cross-sectional area A of a turn of solenoid 300 is roughly proportional to W multiplied by H. For a cross-sectional area A, solenoid 300 may attain a higher inductance by increasing the number of turns M in magnetic field direction B.

Inductance of spiral inductor 100 of FIG. 1 of a fixed cross-sectional area is limited by the number of turns N, which is constrained by the number of metal and via layers available. In contrast, even though solenoid inductor 300 is fabricated using alternating metal and via layers for stacking, as was described with respect to spiral inductor 100 of FIG. 1, the difference in ability to increase the number of turns may be significant. This is because the number of turns of solenoid 300 is not constrained by the number of metal and via layers available as was spiral inductor 100 of FIG. 1. Thus, for a same cross-sectional area, solenoid 300 may have a higher inductance than spiral inductor 100. In other words, for integration of a horizontal inductor as described herein into an existing BEOL flow of an IC, there may be a limited number of metal and via layers for forming such horizontal inductor. Furthermore, other than having a higher inductance for same cross-sectional area, it should be appreciated that solenoid 300 may reside in a more uniform magnetic field, and thus may have a better Q-factor.

To recapitulate, stripes 301 and 307 extend in a widthwise direction W and are substantially parallel with respect to one another. Conductive stacks or posts 320, are used to put stripes 301 and 307 in electrical continuity with one another. Thus, bottoms of conductive stacks 320 are in electrical continuity with ends of conductive stripes 301, and tops of conductive stacks 320 are in electrical continuity with ends of conductive stripes 307. It should be understood that a pair of posts 320, a pair of stripes 307 and a stripe 301, as associated with one another, form an open turn or open loop of solenoid 300. Wires 334, or diagonal wire segments 351, are used to interconnect such open loops to provide coil 330 with turns. Thus it should be appreciated that coil 330 has a lengthwise direction L which is traverse with respect to widthwise direction W for operatively producing a magnetic field direction B which is substantially parallel-planar with an upper surface 491 of a die substrate 490 of an IC in which solenoid inductor 300 is embedded.

Figure 5:
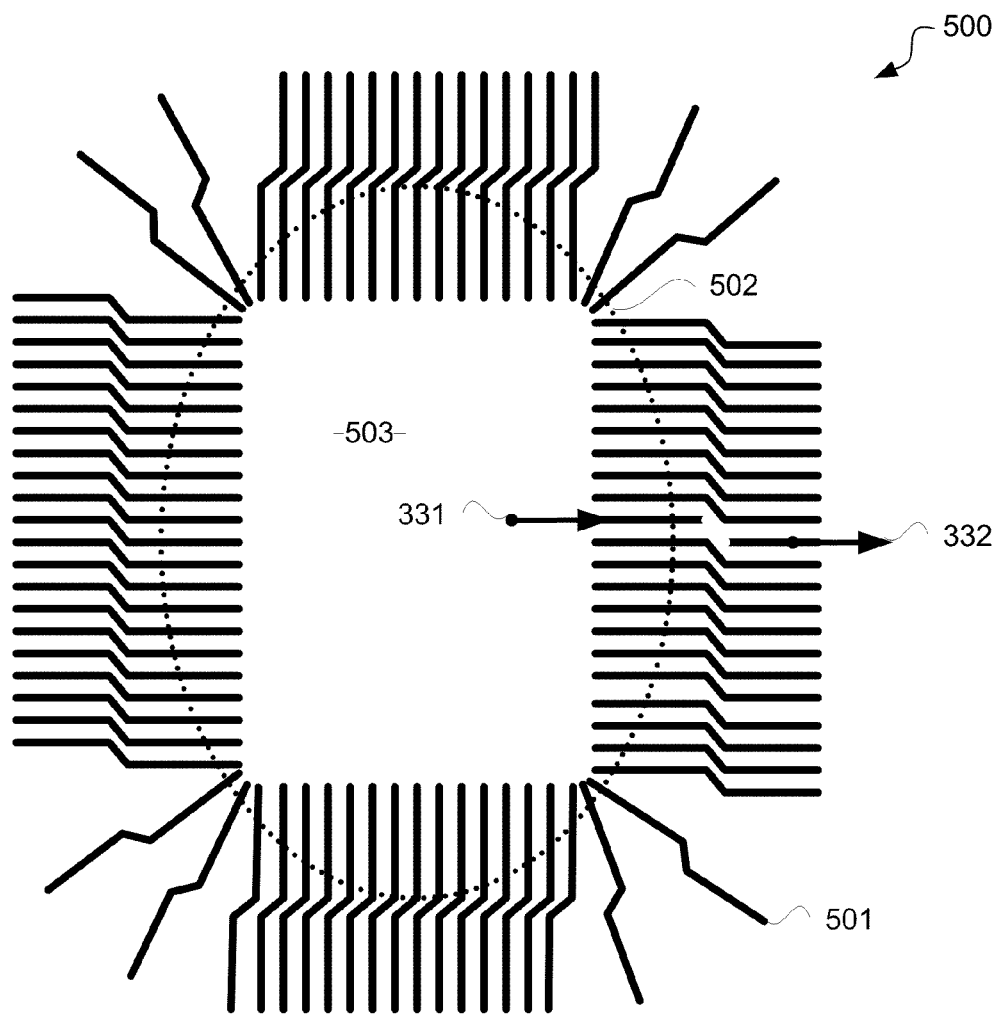
FIG. 5 is top view depicting an exemplary embodiment of a toroid inductor.

FIG. 5 is top view depicting an exemplary embodiment of a toroid inductor or toroid 500. Toroid 500 is a variation of solenoid 300, namely forming solenoid 300 to form a coil with a ring or ring-like shape. Accordingly, port 331 and port 332 of toroid 500 may be respectively associated with those ports of solenoid 300. Each turn 501 of toroid 500 may be associated with a turn of solenoid 300, though a closed loop 502 of such turns is formed defining an internal region 503.

Figure 6A:
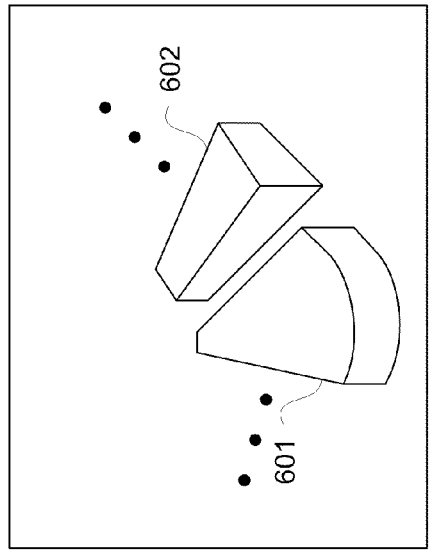
FIG. 6A is a top view depicting an exemplary embodiment of an etched, filled, and polished metal layer for forming the toroid inductor of FIG. 5.
Figure 6B:
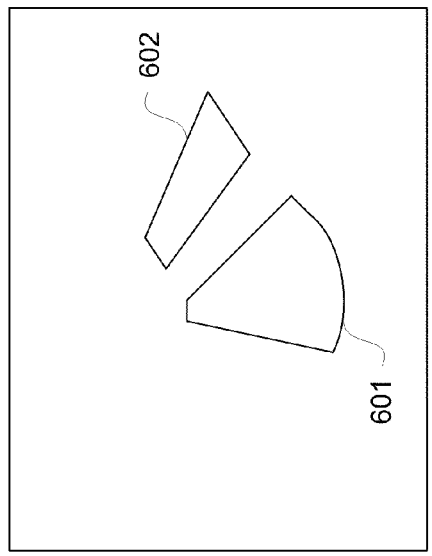
FIG. 6B is a perspective view depicting the exemplary embodiment of FIG. 6A with dielectric material removed.

FIG. 6A is a top view depicting an exemplary embodiment of an etched, filled, and polished metal layer 600 for forming toroid 500 of FIG. 5. Metal layer 600 includes segments 601 and 602 which are formed of a metal or other conductor. Segments 601 and 602 are part of toroid 500 of FIG. 5. A dielectric material 200 (not shown in FIGS. 6A through 6C) may be used for patterning in order to form recesses for filling with metal to form segments 601 and 602 followed by an etch-back or polishing. If dielectric material 200 is removed, segments 601 and 602 may appear as blocks as illustratively depicted in the perspective view of FIG. 6B.

Figure 6C:
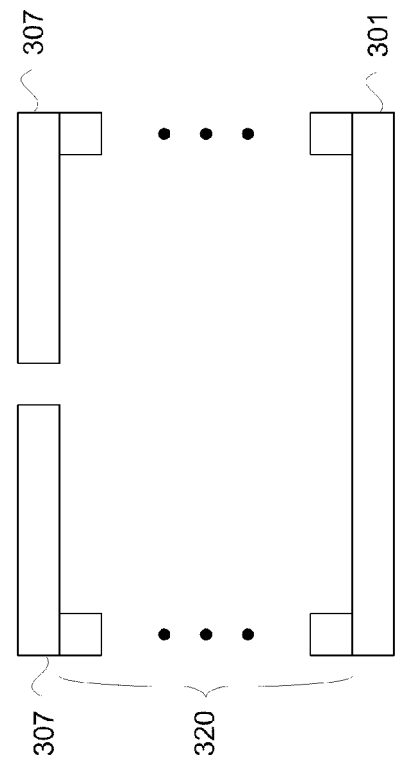
FIG. 6C is a side view depicting an exemplary embodiment of an open loop for the solenoid inductor of FIG. 3A and the toroid inductor of FIG. 5.

FIG. 6C is a side view depicting an exemplary embodiment of an open loop 610 of solenoid 300 or toroid 500. Open loop 610 may include a bottom stripe 301, posts 320, and stripes 307 as previously described. The number of blocks forming posts 320 may vary depending on implementation, and may vary depending on the number of via and metal layers available to use for forming such blocks. It should be understood that open loop 610 may form part of solenoid 300 or may be used in forming toroid 500.

Figure 7:
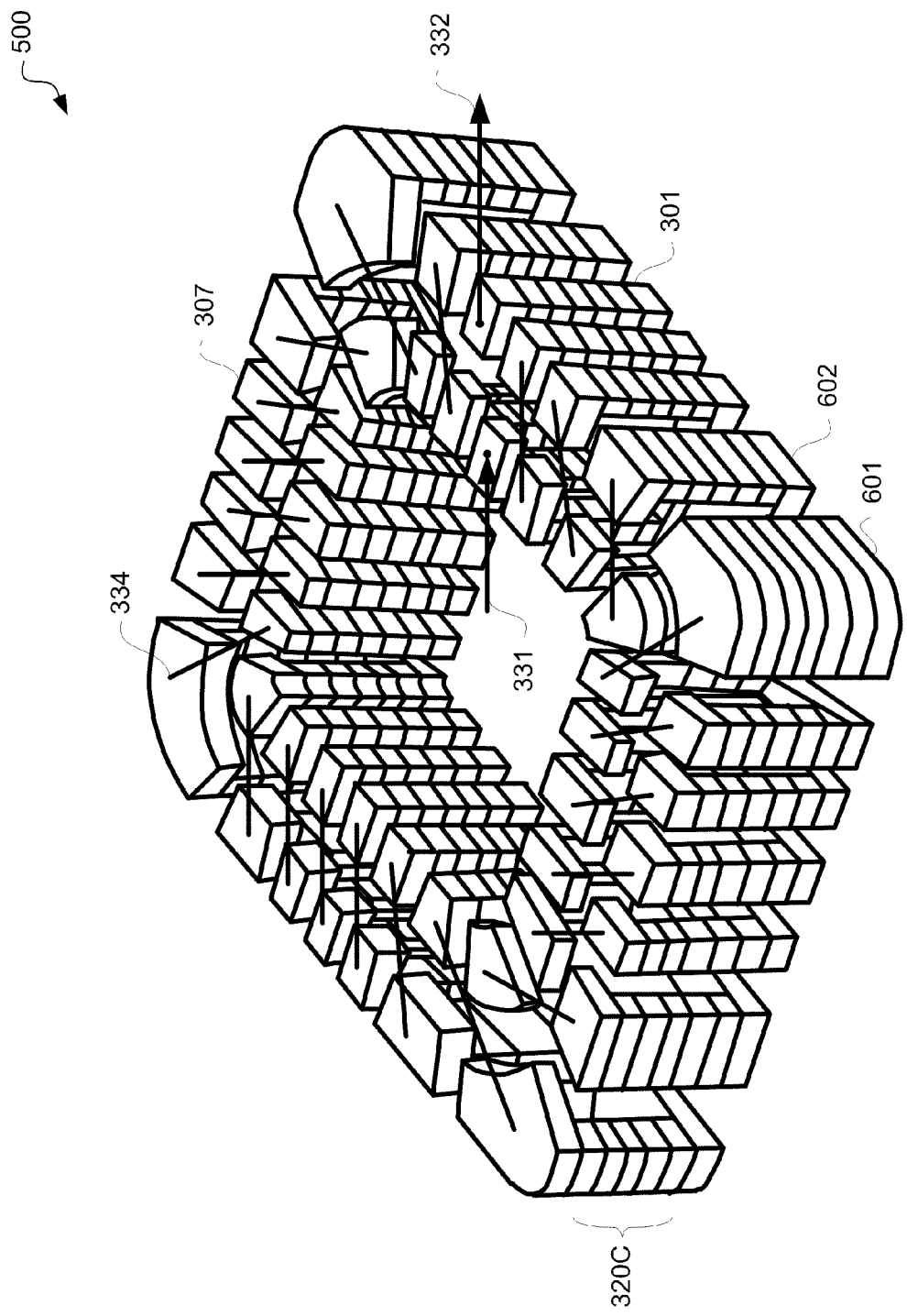
FIG. 7 is a perspective view depicting an exemplary embodiment of the toroid inductor of FIG. 5.

FIG. 7 is a perspective view depicting an exemplary embodiment of toroid 500. Again, open loops, such as open loops 610 of FIG. 6C, may be used to form toroid 500 as previously described with reference to FIG. 3A. It should be appreciated that because of the geometric configuration of a closed loop, corners of toroid 500 may be shaped accordingly. Thus, for example, a stack 320C may provide a corner as opposed to posts as previously described with respect to posts 320 of FIG. 3A. Even though particular shapes were illustratively depicted in FIGS. 6A, 6B, and 7, it should be appreciated that other geometric shapes, namely other than a square with rounded corners as illustratively depicted in FIG. 7, may be used.

Loop 502 of FIG. 5 indicates a magnetic field generated by toroid 500 when current is passed from port A 331 to port B 332. It should be understood that magnetic field 502 is substantially confined to be within toroid 500, and thus does not affect surrounding circuitry. Such magnetic field 502 is substantially parallel-planar with an upper surface of a die substrate of an IC in which toroid inductor 500 is embedded. Toroid inductor 500 may be implemented in applications that involve a high inductance with minimal magnetic flux into surrounding circuitry. Toroid inductor 500 has a relatively high Q-factor. Even though toroid 500 is illustratively depicted with wires 334, it should be understood that a metal layer used to form a topmost layer of toroid 500 may further include wire segments, such as wire segments 351, for interconnecting open loops one to another for providing a coil with electrical continuity from input to output port.

With simultaneous reference to FIGS. 1, 3A, and 7, it should be understood that spiral inductor 100, solenoid 300, and toroid 500, namely inductors, may all have their core composed of dielectric material 200. In other words, open loops of inductors 300 and 500 and spiral openings of inductor 100, as well as other gaps in the structures thereof, may have dielectric material 200 present in such gaps. Dielectric material 200 may be a high permeability material, such as nickel and iron alloy, which is introduced into the core of such inductors to enhance inductance. Furthermore, it should be understood that the number of turns of inductors may be reduced along with smaller cross-sectional area to form very small inductors, in particular with respect to spiral inductor 100 and solenoid 300. In other words, inductors 100 and 300 may be micro machined.

It should be appreciated that inductors 100, 300, and 500 may be formed using conventional interconnect metal semiconductor processing as used in conventional IC BEOL processing. Conventionally, metals such as aluminum and copper are used in such semiconductor processing. Alternatively, nickel may be used as it has a relatively higher magnetic permeability than aluminum and copper. Accordingly, nickel or a nickel silicide may be used. More particularly, nickel silicide may be used in a front end of the line ("FEOL") for forming lower layers of inductors 100, 300, and 500.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A method for forming an inductor, comprising:
   forming spaced apart first stripes substantially parallel with respect to one another as part of a first metal layer;
   forming first contacts respectively associated with upper surface ends of each of the first stripes as part of a first via layer;
   forming second contacts respectively associated with each of the first contacts as part of a second metal layer;
   forming third contacts respectively associated with each of the second contacts as part of a second via layer;
   forming spaced apart second stripes substantially parallel with respect to one another and to the first stripes as part of a third metal layer; and
   interconnecting the second stripes with wire bridges, wherein a combination of the second stripes and the wire bridges forms a portion of the inductor.

2. The method according to claim 1, wherein:
   the first contacts are respectively in contact with the upper surface ends of the first stripes;
   the second contacts are respectively in contact with upper surfaces of the first contacts;
   the third contacts are respectively in contact with upper surfaces of the second contacts;
   the first contacts, the second contacts, and the third contacts in respective combination provide at least portions of posts;
   lower surface ends of the second stripes are respectively in contact with upper surfaces of the posts; and
   the first stripes, the posts, and the second stripes in combination provide turns of a coil.

3. The method according to claim 2, further comprising:
   forming a first stripe segment and a second stripe segment as part of the third metal layer;
   wherein:
     the first stripe segment is for a first port of the coil; and
     the second stripe segment is for a second port of the coil.

4. The method according to claim 2, wherein the at least portions of the posts provided by the first contacts, the second contacts, and the third contacts have a uniform cross sectional shape.

5. The method according to claim 3, wherein one of the first port and the second port of the coil is an input port, and another one of the first port and the second port of the coil is an output port, thereby allowing electrical current to flow in a clockwise or counter-clockwise direction around the coil.

6. The method according to claim 1, wherein the second stripes and the wire bridges are at a same layer.

7. An embedded inductor, comprising:
   a first metal layer, wherein at least a part of the first metal layer comprises first stripes that are spaced apart and are substantially parallel with respect to one another;
   a first via layer, wherein at least a part of the first via layer comprises first contacts that are respectively associated with upper surface ends of each of the first stripes;
   a second metal layer, wherein at least a part of the second metal layer comprises second contacts that are respectively associated with each of the first contacts;
   a second via layer, wherein at least a part of the second via layer comprises third contacts that are respectively associated with each of the second contacts; and
   a third metal layer, wherein at least a part of the third metal layer comprises second stripes that are spaced apart, and are substantially parallel with respect to one another and to the first stripes,
   wherein the second stripes are interconnected with wire bridges, and a combination of the second stripes and the wire bridges forms a portion of the inductor.

8. The embedded inductor according to claim 7, wherein:
   the first contacts are respectively in contact with the upper surface ends of the first stripes;
   the second contacts are respectively in contact with upper surfaces of the first contacts;
   the third contacts are respectively in contact with upper surfaces of the second contacts;
   the first contacts, the second contacts, and the third contacts in combination provide at least portions of posts;
   lower surface ends of the second stripes are respectively in contact with upper surfaces of the posts; and
   the first stripes, the posts, and the second stripes in combination provide turns of a coil.

9. The embedded inductor according to claim 8, wherein the at least portions of the posts provided by the first contacts, the second contacts, and the third contacts have a uniform cross sectional shape.

10. The embedded inductor according to claim 8, wherein:
    the third metal layer comprises a first stripe segment and a second stripe segment; and
    the first stripe segment of the third metal layer is for a first port of the coil, and the second stripe segment of the third metal layer is for a second port of the coil.

11. The embedded inductor according to claim 10, wherein one of the first port and the second port of the coil is an input port, and another one of the first port and the second port of the coil is an output port, thereby allowing electrical current to flow in a clockwise or counter-clockwise direction around the coil.

12. The embedded inductor according to claim 10, wherein the second stripes and the wire bridges are at a same layer.

* * * * *